United States Patent [19]
Szlenski

[11] Patent Number: 5,844,884
[45] Date of Patent: Dec. 1, 1998

[54] BATTERY MONITORING

[75] Inventor: Marek Szlenski, Copenhagen, Denmark

[73] Assignee: Nokia Mobile Phones Limited, Espoo, Finland

[21] Appl. No.: 842,177

[22] Filed: Apr. 23, 1997

[30] Foreign Application Priority Data

Apr. 25, 1996 [GB] United Kingdom ................... 9608535

[51] Int. Cl.$^6$ ................................................. H01M 10/44
[52] U.S. Cl. ........................................... 370/149; 374/429
[58] Field of Search ..................................... 320/149, 136, 320/147; 364/492, 483; 324/427, 428

[56] References Cited

U.S. PATENT DOCUMENTS

| | | | |
|---|---|---|---|
| 4,952,862 | 8/1990 | Biagetti et al. | ............................ 320/48 |
| 5,248,929 | 9/1993 | Burke | ....................................... 320/127 |
| 5,321,627 | 6/1994 | Reher | ....................................... 364/483 |
| 5,349,630 | 9/1994 | Sointula | ..................................... 379/58 |
| 5,564,074 | 10/1996 | Juntti | ....................................... 455/67.1 |
| 5,608,324 | 3/1997 | Yoshida | .................................... 324/426 |
| 5,617,324 | 4/1997 | Arai | ........................................... 364/483 |
| 5,631,540 | 5/1997 | Nguyen | ................................... 320/127 |

FOREIGN PATENT DOCUMENTS

0505333 A2   9/1992   European Pat. Off. .

*Primary Examiner*—Robert E. Nappi
*Assistant Examiner*—Gregory J. Toatley, Jr.
*Attorney, Agent, or Firm*—Perman & Green, LLP

[57] ABSTRACT

A battery voltage course is estimated during the actual discharge. The battery voltage is registered at a plurality of different times, and parameters for describing the battery discharge course are determined locally for said times in response to the registered values and the associated times. The registered service life is determined on the basis of the battery discharge course, and the remaining service life may e.g. be the remaining standby time of a radio telephone.

22 Claims, 3 Drawing Sheets

BATTERY MONITORING

BACKGROUND OF THE INVENTION

The invention concerns a method of estimating battery discharge characteristics (or a battery voltage course during discharge). The invention also concerns a battery monitoring module and a radio telephone having such a module.

The invention provides a method enabling the voltage course of a battery to be estimated during discharge without prior knowledge of the parameters of the battery.

SUMMARY OF THE INVENTION

The invention provides a method enabling the voltage course of a battery to be estimated during discharge without prior knowledge of the parameters of the battery.

This is achieved by the method of the invention in that values representing the battery voltage are registered at a plurality of times, and that parameters for describing the battery discharge course are determined locally for said times in response to the registered values and the associated times. This means that the battery discharge course may be determined on the basis of a plurality of measurement points. The actual model of the battery discharge may hereby be made very simple, since it is not necessary to consider ageing, slowly varying temperature fluctuations, etc. The method of the invention may be considered as a technique which simplifies a very complex algorithm, as the parameters of the algorithm, which vary with the temperature, ageing and other conditions, are determined numerically, without the actual, complex relations having to be studied.

The technique of the invention may be used universally (for all types of batteries), as the actual properties of the battery, such as capacity, are not included in the calculations. It should finally be noted that the method is not affected by factors including that the battery has not been fully charged, that it is not discharged prior to recharging, etc.

In the preferred method of the invention for estimating the battery voltage, this is assumed to decrease as a power function with time t from an initial value. The battery discharge is assumed to follow the voltage course $V_{bat}=\Phi-\xi\alpha^t$, where $\Phi, \xi$ and $\alpha$ are constants. A time span before the battery voltage has decreased to a predetermined voltage level may be determined on the basis of the sensed values and the time span between the sensing times. This time span may be determined as $t=ln((\Phi-V_T)/\xi)/ln\alpha$, where $V_T$ is the predetermined voltage level.

The battery voltage course may be estimated locally by sensing the battery voltage, $V_{bat}$, at three times which are positioned at such a great mutual distance that the changes in the battery voltage are significant with respect to the uncertainty in the measurement of the voltages.

The voltage course may be updated currently, as the measurements of the battery voltage are merely to be repeated periodically. It may also be decided to update just once in a while to compensate for ageing.

The invention moreover concerns a battery monitoring unit comprising an associated control device, a battery voltage sensor to sense values representing the battery voltage, and a timer. On the basis of the sensed values and the associated times, the control unit determines the parameters for describing the battery discharge course locally for said times in response to the registered values and the associated times. A time span before the battery voltage has dropped to a predetermined voltage level may hereby be estimated on the basis of measured parameters, without this requiring knowledge of battery-specific parameters. The predetermined voltage level is a voltage level $V_T$ and is usually determined by the lowest acceptable battery voltage for the electric appliance with which the battery monitoring unit is used.

The invention moreover concerns a radio telephone having a voltage supply in the form of a battery and comprising a battery monitoring unit with an associated control device, a battery voltage sensor to sense values representing the battery voltage, and a timer. On the basis of the sensed values and the associated times, the control unit determines the parameters for describing the battery discharge course locally for said times in response to the registered values and the time span between the registration times.

The invention also concerns a radio telephone having a battery and a battery monitoring means for estimating a battery voltage course by sensing the battery voltage, $V_{bat}$, via a battery voltage sensor at a plurality of times, and an estimating means for calculating a telephone service life measure before the battery voltage has decreased to a predetermined level. The estimating means updates the measure of the remaining service life if the battery voltage sensor registers a change in the voltage course. The actual measure of the remaining service life is displayed by a display means. The remaining service life may e.g. be displayed as a number of minutes in standby mode or as a percentage of the total time. The latter form of display has the advantage that the number applies universally irrespective of the telephone mode.

The battery monitoring according to the invention depends on electric parameters, i.e. parameters which can be measured during the use of the battery. The method of the invention allows the future behaviour of the battery to be predicted on the basis of a few measurements performed within a short time span. The future behaviour of the battery may be corrected or re-estimated if the current changes, which can take place on the basis of the parameters already calculated. The method in the preferred embodiment of the invention is self-correcting.

BRIEF DESCRIPTION OF THE DRAWINGS

The invention will be explained more fully below, by way of example, in connection with preferred embodiments and with reference to the drawing, in which.

DETAILED DESCRIPTION OF THE INVENTION

Figure 1:
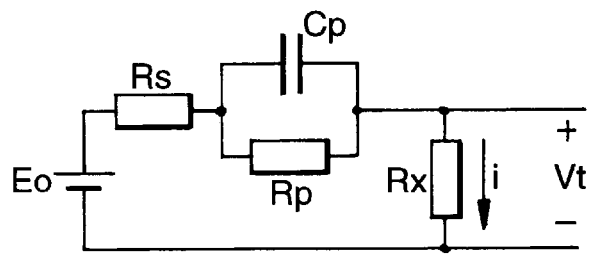
FIG. 1 schematically shows a battery model with which the invention is to be explained.

The invention is based on the use of a simple battery model shown in FIG. 1 as a basis for setting up a battery discharge algorithm. The model contains a voltage source which supplies a voltage $E_0$ via an internal impedance $R_s$, $R_p$, and $C_p$ to a load $R_x$. The current i, which runs through the load $R_x$, is constant, while the voltage $V_r=V_r(t)$ across the load $R_x$ varies with the time t. It is hereby possible to set up an expression of the battery voltage which, with a constant current, assumes the following course:

$$V(t) = \Phi - \xi \alpha^t \gamma \exp(-t/R_p C_p),$$

where $\Phi$, $\xi$ and $\alpha$ describe time invariant functions of i. $\gamma$ may be divided into a series of time invariant portions, but this requires the use of some power series (Bessel functions). The term in which $\gamma$ is included vanishes quickly, because it has a negative exponent. If the transient which takes place after the battery has been fully charged is disregarded, then this term may be left totally out of consideration in connection with the discharge. In other words, the battery voltage may be described by the expression:

$$V_{bat}(t) = \Phi - \xi \alpha^t,$$

where $\Phi$, $\xi$ and $\alpha$ are constant at a constant current, but vary in a well-defined manner when the current varies.

When considering this expression, which is general for all types of batteries which have been studied in the setting up of the above model, and comparing the expression with the experimentally found values, it will be seen that the three parameters are battery-specific, i.e. the parameters vary from battery type to battery type, between different batteries within the same battery type, and for the same battery at different loads, temperatures, etc. Further, the start time of the discharge must be known.

However, the battery voltage expression is rather special, it being possible to move the discharge start time during discharge and to estimate new parameters by means of which the future discharge may then be described in exactly the same manner—merely on the basis of the new start time.

This may be explained as follows:

$$V(t)_{start\ time\ t=0} = \Phi - \xi \alpha^t.$$

If the start time is to be changed to $t=\tau$, i.e. $t_1 = t-\tau$, then the battery voltage may be expressed as follows:

$$V(t)_{start\ time\ t=\tau} = \Phi - \xi \alpha^{t_1} = \Phi - \xi \alpha^t \alpha^{-\tau},$$

where $\xi \alpha^{-\tau}$ may be considered as a new time invariant parameter. The invention is thus based on the possibility of determining local battery parameters $\Phi$, $\xi$ and $\alpha$ at any time, without the battery-specific parameters having to be known. The battery voltage may be considered as a non-linear function of time, with the expression applying to stable states, i.e. approximately constant temperature, power consumption, etc. The problem of predicting the discharge course of the battery is then reduced to the question of estimating the three local battery parameters $\Phi$, $\xi$ and $\alpha$. Measuring the battery voltage at three different times additionally simplifies the problem to the solution of the three non-linear equations having three unknown quantities.

$$V(t=t0) = V0 = \Phi - \xi \alpha^{t0}$$

$$V(t=t1) = V1 = \Phi - \xi \alpha^{t1}$$

$$V(t=t2) = V2 = \Phi - \xi \alpha^{t2}$$

Here, t0 may advantageously be put equal to 0, t1 equal to $t0+\Delta t$, and t2 equal to $t0+\Delta t$. Hence:

$$V(t) = \Phi - \xi \alpha^t$$

$$V(t+\Delta t) = \Phi - \xi \alpha^{t+\Delta t}$$

$$V(t+2\Delta t) = \Phi - \xi \alpha^{t+2\Delta t}$$

Since t0 is equal to zero, three local battery parameters $\Phi$, $\xi$ and $\alpha$ may be determined exactly as:

$$\alpha = \exp(ln((V(t_{=0}+\Delta t)-V(t_{=0}+2\Delta t))/(V(t_{=0})-V(t_{=0}+\Delta t)))/\Delta t)$$

$$\xi = (V(t_{=0})-V(t_{=0}+\Delta t))^2/(2V(t_{=0}+\Delta t)-V(t_{=0}+2\Delta t)-V(t_{=0}))$$

$$\Phi = V(t_{=0}) - (V(t_{=0})-V(t_{=0}+\Delta t))^2/(2V(t_{=0}+\Delta t)-V(t_{=0}+2\Delta t)-V(t_{=0})), \quad (10)$$

where ln is the natural logarithm. It has hereby been made possible to set up an expression of the discharge course of any battery, which has been done solely by measuring the battery voltage three times and registering the interval between the measurements. No prior knowledge of the battery parameters is required.

The invention may be implemented in all electric appliances which have batteries as the source of energy. When a preferred embodiment of the invention will be explained below, this will be done with reference to radio telephones, which are taken to mean portable telephones communicating with other telephones via radio waves, usually via base stations which may in turn be interconnected through a communications net. The radio telephones may be based on both analog and digital communication (e.g. NMT or GSM) as well as all other types, including cordless ones (e.g. DECT).

When working e.g. with a GSM telephone, there will be an incorporated threshold value $V_T$, whereby the telephone is switched off automatically when the battery voltage reaches this threshold value. A call causes the battery voltage to decrease because of increased power consumption. If the battery voltage during this voltage drop gets below the minimum voltage at which the telephone can operate, it will nevertheless not be possible to establish a connection. This threshold value has therefore been incorporated.

This means in practice that the threshold value is the voltage which is usually aimed at when the remaining standby time is to be estimated. This time may be estimated in a simple manner when the three local battery parameters $\Phi$, $\xi$ and $\alpha$ have been determined in equations (8), (9) and (10), as the time may be expressed as follows:

$$t = ln((\Phi-V_T)/\xi)/ln\alpha,$$

where $V_T$ is the minimum voltage value which can be accepted, e.g. the above-mentioned threshold value known from i.a. the GSM system.

Figure 2:
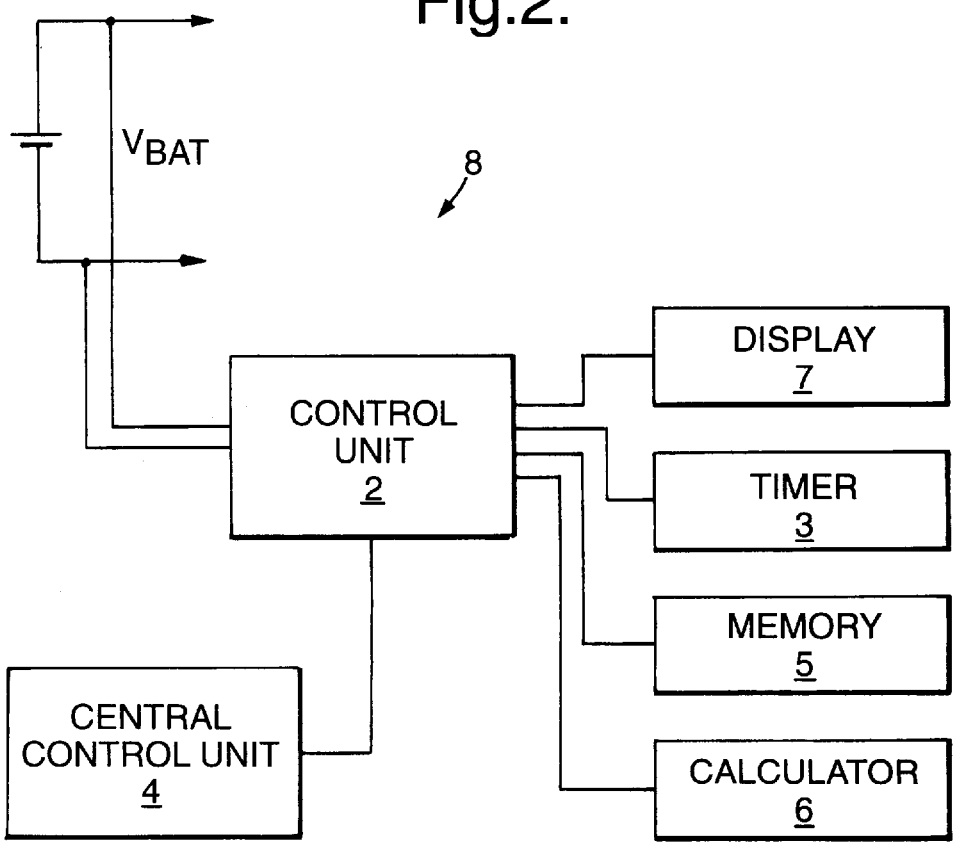
FIG. 2 schematically shows a preferred way of implementing the principle of the invention.

FIG. 2 shows how the invention in a preferred embodiment may be implemented in a battery driven unit 8, e.g. a radio telephone. A battery 1 supplies a voltage to the unit 8, and the battery voltage is sensed at intervals under the control of a control unit 2. At each sensing, the control unit 2 moreover receives time information from a timer 3. This information representing the battery voltage and a time value, either related to absolute time or to the length of the interval between the actual voltage value and the preceding one, is transferred to a memory 5. The control unit can obtain data from the memory when the parameters $\Phi$, $\xi$ and $\alpha$ are to be calculated by means of the expressions (8), (9) and (10), to enable the time t to be subsequently determined by means of the expression (11). This takes place in a calculator 6, and the calculated time will then usually be transferred for display on the display 7 of the unit.

In case of radio telephones, the power consumption varies in response to the actual telephone mode, and the control unit 2 must therefore have information on the actual telephone mode. This information can most easily be obtained from the central control unit 4 of the telephone and is used for correcting the calculated remaining time for the increased power consumption. In practice, the units 2–6 will be integrated centrally in the telephone, but are shown separated here to illustrate the individual functions.

When considering equation (4), it will be seen that $\Phi$ may in practice be considered as being a constant under constant conditions, which means that the battery is not replaced by another battery, that the power consuming unit is not subjected to changes in power consumption, temperature, etc. If this is met, then, after the start of the power consuming appliance, two measurements may be made to determine $\xi$ and $\alpha$ and thereby the time t. However, this requires a stored value for $\Phi$. To ensure that the battery has not been replaced, whereby the $\Phi$ value is no longer valid, the final battery voltage from the last operational period may be stored and be compared with the start battery voltage at the operational period just started, and if the two values are consistent, the time estimating procedure may be started as outlined.

When the power consuming appliance is a radio telephone, it is usually preferred to estimate all three parameters $\Phi$, $\xi$ and $\alpha$ each time the telephone is switched on and currently update the parameters during the entire operational period, as many users have several batteries so that these can just be replaced without the telephone itself having to be placed in a charger. Further, the telephone is frequently subjected to changing surroundings, and the power consumption varies depending on which active mode the telephone is in.

When the telephone is switched on, it is in standby mode, until the user interface is used, a call is made or received or the like.

The battery monitoring may advantageously take place by sensing the battery voltage at regular intervals, but this is frequently not possible in practice, as the current (load) may change en route because of a call or the like. If intermediate intervals are of exactly the same length, the discharge curve parameters may be calculated by the equations (8), (9) and (10). If the intermediate intervals are of different lengths, the equations (8), (9) and (10) cannot be used, but a standard calculating program may be used instead for iterative solution of the three non-linear equations (5), (6) and (7). This requires a little more calculating power, but the number of calculations may be reduced by initially interpolating/extrapolating to a virtual voltage value by means of the actually measured values and the last intermediate time interval. Alternatively, the time may be calculated on the basis of a mathematical perturbation of the off-line parameters $\Phi$, $\xi$ and $\alpha$.

To obtain a satisfactory uncertainty of the remaining time, the intermediate intervals must be so long that the battery voltage changes are significant with respect to the measurement uncertainty. Radio telephone standby time, for example, tends to increase because of a constantly decreasing energy consumption, and the changes in the battery voltages of future telephone generations must therefore be assumed to take place at a slower rate than today. Further, also the measurement uncertainty must be assumed to decrease. With a measurement unit which in terms of price lends itself for incorporation in consumer products without the competitiveness of the products being impaired, a length of the intermediate intervals of about 15 minutes is considered realistic. If the estimate is based solely on the outlined method, the estimate of the first thirty minutes must be considered unreliable.

This, however, may be compensated by storing some values of the parameters $\Phi$, $\xi$ and $\alpha$. Each time the telephone is charged fully, the parameters $\Phi$, $\xi$ and $\alpha$ corresponding to full charge may be calculated and stored. The next time the telephone is charged fully, the old set of parameters is used for the time estimate, until a new set of parameters has been calculated. The new set hereby replaces the old set in the memory. A reasonably updated set of parameters will thus always be available in the memory.

When the actual parameters $\Phi$, $\xi$ and $\alpha$ are currently stored in the memory, these may be used if the telephone is switched off and on again. A measure of the associated battery voltage may be stored together with the parameters, and comparison of the actual battery voltage and the stored values provides a measure of whether it is realistic to use the old set of parameters in the estimation of the remaining time. If the old parameters cannot be used, the display indicates that there is no available estimate of the remaining time.

Figure 3:
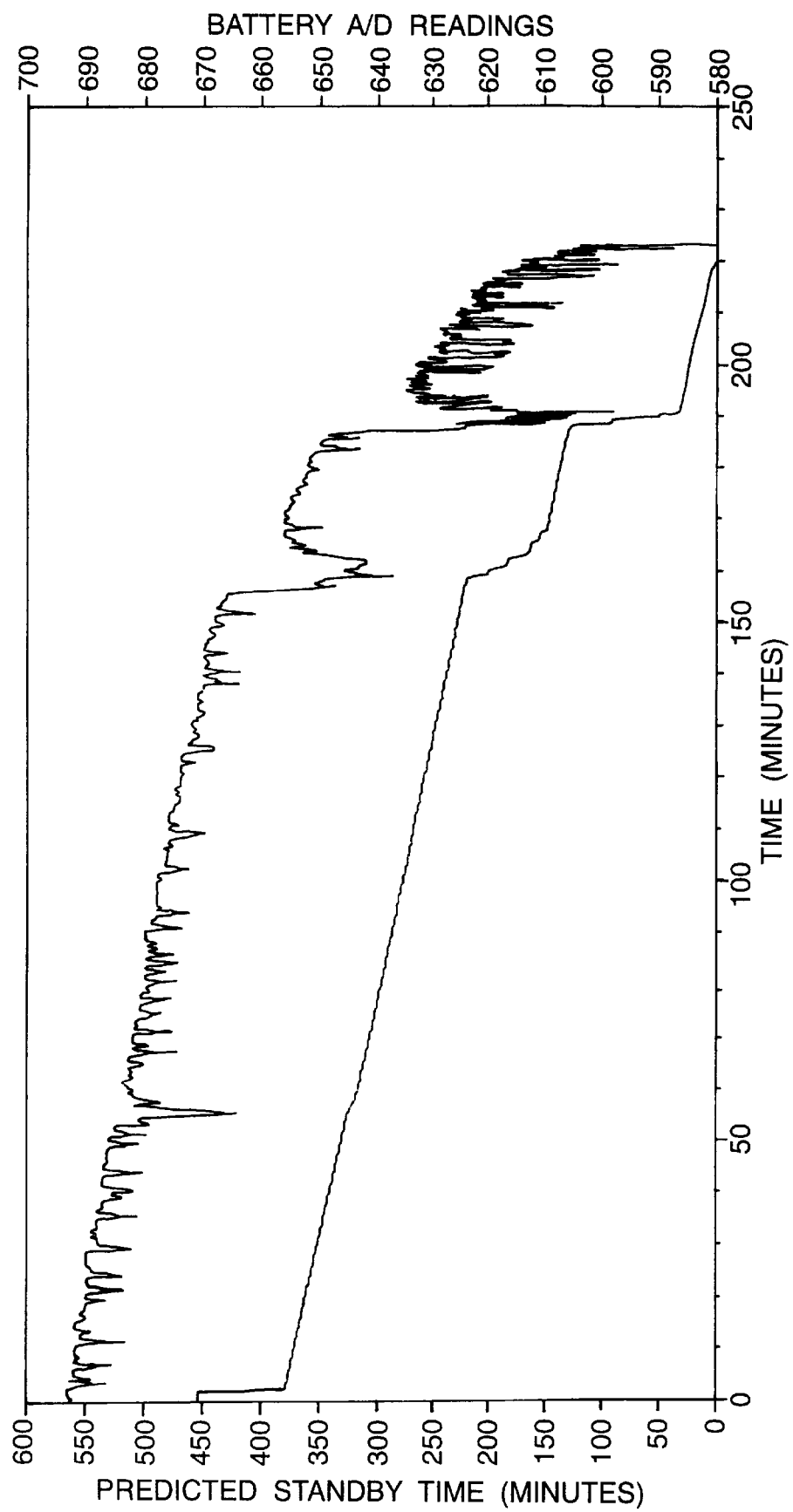
FIG. 3 shows an example of a battery discharge course.

Referring now to FIG. 3, a discharge curve for an NiMH battery having five cells and a capacity of 500 mAH is shown. The discharge has taken place in set-up where the battery voltage of a GSM telephone (Nokia 2110) has been measured during the entire sequence, while the current (load) changes in connection with switching between standby mode and conversation mode. In the upper curve, the diagram shows a measure of the read battery voltage $V_{bat}$ as a function of time, while the lower curve illustrates the remaining time, likewise as a function of time. The horizontal axis of the diagram shows the time in minutes, while the vertical axis to the right of the diagram represents the battery voltage.

The measurement unit on the vertical, right axis is "Battery A/D Readings", which is a measure which, when multiplied with a conversion factor, gives the battery voltage in volts. The conversion factor per se has no importance in this connection, it being the relation between the voltages which is used in the calculations. The curve is plotted in connection with an adaptive measurement, where the battery voltage course is estimated, and the course is corrected in response to a current comparison between the expected voltage and the measured voltage.

The vertical, left axis shows the time estimate at a given time as a function of time and estimated by the method of the invention. It will be seen that the estimated time decreases evenly after about 4 minutes (when a reliable estimate is obtained) from about 380 minutes to about 220 minutes after just under 160 minutes. The battery voltages decreases approximately evenly with minor fluctuations during this interval, the reason being that the current is constant, and a brief jump in power consumption can be seen after 45 minutes. The fluctuations are caused by telephone scanning among the GSM channels. As the time estimate in the diagram refers to the standby current, the time estimate during standby decreases by 1 minute/minute. After 160 minutes the battery voltage decreases for a period of about 7 minutes as a consequence of increased power consumption, and then the voltage reassumes an evenly decreasing course for another 25 minutes. Then the voltage decreases steeply for about 5 minutes as a consequence of a great power consumption, following which the voltage reassumes an evenly decreasing course for another 35 minutes. It will be seen that the time estimate in the time estimate curve decreases steeply during the increased power consumption, and then reassumes an evenly decreasing course with 1 minute/minute. During the increased power consumption after 190 minutes the time estimate decreases by about 100 minutes in merely 3 minutes, which is caused by a very high power consumption, which quickly depletes the battery of energy. The reason why the estimate reaches zero after 220 minutes is that the battery has reached the voltage, $V_T$, which is used as input in equation (11).

Figure 4:
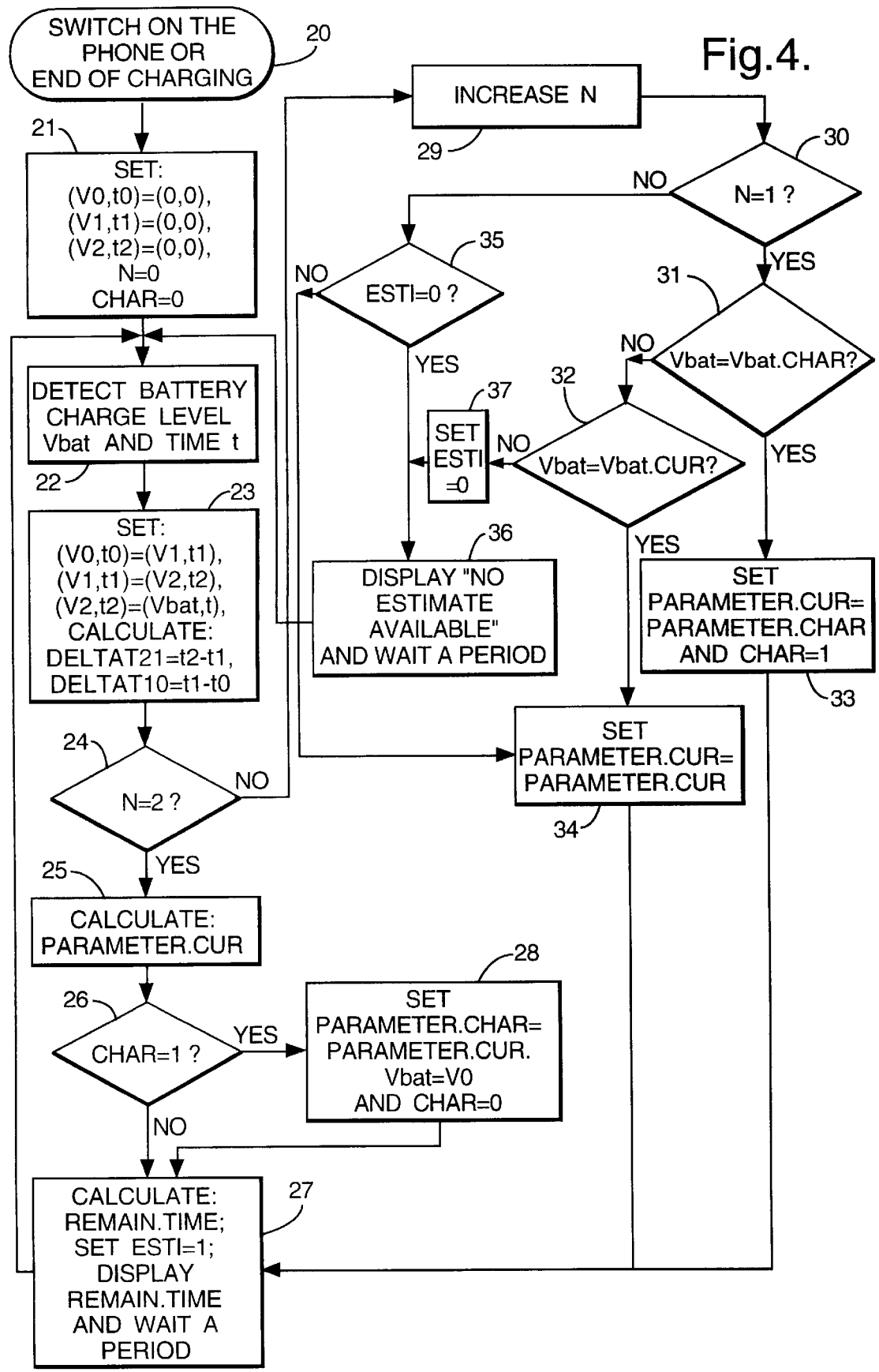
FIG. 4 shows a flow chart to illustrate a preferred method of the invention.

Referring to FIG. 4, the method of the invention will be explained in connection with a radio telephone. When a telephone is switched on, or if the battery monitoring control unit 2 is informed that the battery is being charged, the control unit jumps to stage 20 in the flow chart shown in FIG. 4. If the battery is being charged, the procedure is recommenced when charging has been completed. This is followed by resetting of the three voltage values V0, V1 and V2 which are used in the calculation of the battery parameters by means of formulae (8), (9) and (10). The associated times t0, t1 and t2 are reset at the same time.

The three indicator parameters are reset in stage 21. The first one is a parameter N indicating how many reliable voltage measurements are available. Maximum in the embodiment outlined will be three (corresponding to N=2), as three equations having three unknown quantities are employed here. CHAR is a parameter indicating whether the charging of the battery has just been completed. This parameter might be set in stage 21, since the control unit knows whether the telephone is being charged. However, it is a clear advantage to move the parameter setting to stage 33, as it is checked here whether the battery voltage is tantamount to full charge of the battery, and that the charge is not just a partial charge, or the battery has been replaced prior to charging. Finally, an indication parameter Vbat.CUR is set at the value Vbat. If the telephone is then switched off, Vbat.CUR represents the battery voltage before the telephone was switched off.

Then the battery voltage, Vbat, is sensed, and the associated time, t, is registered. This is done in stage 22. The voltage time values are changed in stage 23, so that the old (V1, t1) values are input as new (V0, t0) values, and correspondingly the old (V2, t2) values are input as new (V1, t1) values. The values (Vbat, t) sensed in stage 22 are input as new (V2, t2) values. Simultaneously, the lengths DELTAT21(=t2−t1) and DELTAT10(t1−t0) of the intervals between the voltage measurements are calculated.

It is checked in stage 24 whether there are three reliable voltage measurements, in which case N assumes the value 2. This will not be the case immediately after charging has been completed or immediately after the telephone has been switched on. If N assumes the value 2, PARAMETER.CUR ($\Phi$, $\xi$ and $\alpha$ for t0) is calculated in stage 25, which usually takes place by solving the equations (5), (6) and (7) numerically by means of an iterative method.

The value of CHAR is checked in stage 26, and if this value is 1, then the three voltage values set in stage 23 are the first three voltage values after completed charging. If this is the case, PARAMETER.CHAR is set at the value PARAMETER.CUR, and the parameter set after the next charging may be then used as start values in the time estimate. Simultaneously, the battery voltage Vbat.CHAR of the charged battery is set at the battery voltage V0 at t0, and the CHAR value is set at the value 0.

After the calculation of PARAMETER.CUR in stage 25, REMAIN.TIME is calculated as the time t in equation (1), which is done in stage 27. Here, ESTI is set at the value 1, thereby indicating that a reliable time estimate is available. The remaining standby time is shown on the display of the telephone, optionally converted into conversation time or another expedient representation. This is followed by a suitable waiting time before jump back to stage 22, where a new battery voltage is input together with the associated time.

If N in stage 24 does not yet assume the value two, N is increase by one in stage 29, and if N is 1, which is checked in stage 30, the battery voltage Vbat measured in stage 22 is compared with the last registered battery voltage, Vbat.CHAR, at full charge, which takes place in stage 31. In case of fair consistency (e.g. within a 1–2% deviation), the battery is recognised as being fully charged and in accordance with the battery which was last charged in the battery. Without further calculations PARAMETER.CUR is set at PARAMETER.CHAR, which was determined in stage 28 in the last session, which takes place in stage 33. Simultaneously, CHAR is set at 1, indicating that the first parameter set, PARAMETER.CUR, which can be calculated in the actual session, is to be set as the new set of parameters, PARAMETER.CUR, instead of the old one. The parameter set, PARAMETER.CUR, which was set in stage 33, is used for calculating REMAIN.TIME in stage 27.

If no consistency is found in stage 31 between the actual battery voltage Vbat and the battery voltage at the last charging, it is checked instead in stage 32 whether the actual battery charge is in accordance with Vbat.CUR, which is the battery charge before the telephone was switched off last. If this is the case, the parameter set PARAMETER.CUR from the last session is set without further calculations as the new parameter set PARAMETER.CUR for the session just started, which takes place in stage 34. The parameter set, PARAMETER.CUR, set in stage 34, is used for calculating REMAIN.TIME in stage 27.

If no consistency is found in stage 32 either between the actual battery voltage Vbat and the battery voltage Vbat.CUR, which is the battery voltage before the telephone was switched off last, then ETSI is put equal to zero in stage 37 to indicate that no reliable estimate is available, and in stage 36 the telephone display indicates that there is still no available reliable estimate. This is followed by a suitable wait before jumping back to stage 22, where a new battery voltage is input together with the associated time.

If N in stage 30 assumed the value 2 (was different from 1), it is checked in stage 35 whether ESTI is zero. If this is the case, the method proceeds to stage 36, where the display shows that there is still no available reliable estimate. IF, on the other hand, it is indicated that there is a reliable estimate in stage 35 (ESTI=1), the old parameter set, PARAMETER.CUR, is set as the new parameter set, PARAMETER.CUR, for the actual session. The parameter set, PARAMETER.CUR, set in stage 34, is used for calculating REMAIN.TIME in stage 27.

The method may then be varied, as needed, so that the standby time may be updated for every 20 minutes or so during the rest of the charging, which corresponds to the diagram in FIG. 4. Alternatively, it may be decided not to update the parameters so that these are kept constant for the rest of the session and are thus not updated until the next time the battery is charged or the next time the telephone is switched on. When using a mathematical perturbation instead, the time estimate may be updated when the battery voltage differs from an expected value.

Clearly, it is specially necessary to check that the battery has not been replaced when the battery is replaceable. If the battery is not replaceable, the algorithm described above will give a result which is satisfactory, even though the parameters are just updated relatively rarely, e.g. once for every five chargings. This means that the interval between a parameter updating series may be great with respect to the duration of the updating series. A mathematically based method may advantageously operate continuously, which will also be expedient in case of battery replacement.

If the power consumption for a period, $\delta t$, is changed to a new constant level, e.g. n times the standby current, i, where n is a positive value, the battery voltage, after the termination of this period, may be expressed by:

$$V_{bat}(t)=\Phi-\xi\alpha^{t+f(n)\delta t},$$

where f(n) is a growing function of n. An analytic expression of f(n) may be set up, and this expression may be expanded in series. A low energy consumption is desired for the radio telephone, which makes it easy to set up a criterion for the expansion in series. As quite few current levels occur in radio telephones, it would be expedient to determine f(n) for the possible current levels. These values are then stored in a look-up table in the manufacture of a radio telephone. It is noted that equation (12) may be rewritten as follows:

$$\begin{aligned}V_{bat}(t) &= \Phi - \xi\alpha^{t+f(n)\delta t} \\ &= \Phi - \xi\alpha^t \alpha^{f(n)\delta t} \\ &= \Phi - \xi_{corrected}\alpha^t,\end{aligned}$$

in which $\xi_{corrected}=\xi\alpha^{f(n)\delta t}$.

It is thus possible to correct the remaining standby time without having to make extra battery measurements, as the expression (14) may be used as input in equation (11). The correction factor in equation (14) may be used for converting the standby time to conversation time, if the user wants this to be displayed as an indication instead of the standby time.

The remaining time t may be expressed as follows:

$$t=ln((\Phi-V_T)/\xi_{corrected})/ln\alpha, \quad (15)$$

the conversion being from the power consumption at a known level, e.g. the standby mode.

Finally, the correction factor in expression (15) may be used so that the user can see how the standby time is affected when switching between various power consuming functions.

The standby time or another measure of the time may advantageously be shown "always on the top" in the display, so that the time will be displayed no matter how the menus are used. Even though the parameters are updated only relatively rarely, the remaining time may advantageously be updated so that the time is displayed with an accuracy determined by the Nyquist criterion, thereby making it possible to obtain an accuracy of the order of 1 minute.

To simplify the calculations, the telephone may advantageously postpone a battery measurement if a conversion is taking place, so that the measurement is made after the termination of the conversation.

The method itself may be implemented as software, there being no special requirements with respect to the hardware of the radio telephone.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

What is claimed is:

1. A method of estimating a battery voltage course during discharge, wherein battery voltage representing values are registered at a plurality of times, wherein parameters for describing the battery discharge course are determined locally at said times in response to the registered values and the associated times, and wherein the battery voltage is assumed to decrease as a power function with time t from an initial value.

2. A method according to claim 1, wherein a time span before the battery voltage has decreased to a predetermined voltage level is determined on the basis of the registered values and the associated times.

3. A method according to claim 1, wherein the battery discharge is assumed to follow the voltage course:

$$V_{bat}=\Phi-\xi\alpha^t,$$

where $\Phi$, $\xi$ and $\alpha$ are parameters which are constant at constant discharge conditions.

4. A method according to claim 3, wherein the constants $\Phi$, $\xi$ and $\alpha$ are determined by iterative solution of three non-linear equations having three unknown quantities:

$$V(t_0)=\Phi-\xi\alpha^{t_0}$$
$$V(t_1)=\Phi-\xi\alpha^{t_1}$$
$$V(t_2)=\Phi-\xi\alpha^{t_2},$$

$V(t_0)$, $V(t_1)$ and $V(t_2)$ being the battery voltage at the times $t_0$, $t_1$ and $t_2$.

5. A method according to claim 3, wherein the three parameters $\Phi$, $\xi$ and $\alpha$ are used for estimating the duration of a time span before the battery voltage has decreased from its actual value $V_{bat}$ to a value $V_T$.

6. A method according to claim 5, wherein the time span t before the battery voltage $V_{bat}(t)$ has decreased to a value $V_T$ may be expressed by:

$$t=ln((\Phi-V_T)/\xi)/ln\alpha.$$

7. A method of estimating a battery voltage course during discharge, wherein battery voltage representing values are registered at a plurality of times, wherein parameters for describing the battery discharge course are determined locally at said times in response to the registered values and the associated times, and wherein the battery voltage course is estimated locally by sensing the battery voltage, $V_{bat}$, at least three times positioned at such a great mutual distance that the changes in battery voltage are significant with respect to the uncertainty in the measurement of the voltages.

8. A battery monitoring unit comprising an associated control device, a battery voltage sensor to sense values representing the battery voltage, and a timer enabling the control unit to register times associated with the sensed values, wherein the control unit, on the basis of the sensed values and the associated times, determines parameters for describing the battery discharge course locally for said times in response to the registered values and the associated times, and wherein the control unit assumes that the battery voltage decreases as a power function with time t from an initial value.

9. A battery monitoring unit according to claim 8, wherein the control unit determines a time span before the battery voltage has decreased to a predetermined voltage level on the basis of the parameters describing the battery discharge course.

10. A battery monitoring unit according to claim 9, wherein the predetermined voltage level is a voltage level $V_T$, determined by the lowest acceptable battery voltage for the electric appliance with which the battery monitoring device is used.

11. A battery monitoring unit comprising an associated control device, a battery voltage sensor to sense values representing the battery voltage, and a timer enabling the control unit to register times associated with the sensed values, wherein the control unit, on the basis of the sensed values and the associated times, determines parameters for describing the battery discharge course locally for said times in response to the registered values and the associated times, and wherein the battery voltage course is estimated locally by sensing the battery voltage, $V_{bat}$, at least three times positioned at such a great mutual distance that the changes in battery voltage are significant with respect to the uncertainty in the measurement of the voltages.

12. A battery monitoring unit comprising an associated control device, a battery voltage sensor to sense values representing the battery voltage, and a timer enabling the control unit to register times associated with the sensed values, wherein the control unit, on the basis of the sensed values and the associated times, determines parameters for describing the battery discharge course locally for said times in response to the registered values and the associated times, and wherein the battery discharge course is assumed to follow the expression:

$$V_{bat} = \Phi - \xi \alpha^t,$$

where $\Phi$, $\xi$ and $\alpha$ are parameters which are constant at constant discharge conditions.

13. A radio telephone having a voltage supply in the form of a battery and comprising a battery monitoring unit with an associated control device, a battery voltage sensor to sense values representing the battery voltage, and a timer enabling the control unit to register times associated with the sensed values, wherein, on the basis of the sensed values and the associated times, the control unit determines parameters for describing the battery discharge course locally for said times in response to the registered values and the associated times, and wherein the control unit assumes that the battery voltage decreases as a power function with time t from an initial value.

14. A radio telephone according to claim 13, wherein the control unit determines a time span before the battery voltage has decreased to a predetermined voltage level on the basis of the parameters describing the battery discharge course.

15. A radio telephone according to claim 14, wherein the predetermined voltage level is the minimum voltage level $V_T$ which the radio telephone accepts for reliable operation.

16. A radio telephone having a voltage supply in the form of a battery and comprising a battery monitoring unit with an associated control device, a battery voltage sensor to sense values representing the battery voltage, and a timer enabling the control unit to register times associated with the sensed values, wherein, on the basis of the sensed values and the associated times, the control unit determines parameters for describing the battery discharge course locally for said times in response to the registered values and the associated times, wherein the battery is rechargeable and replaceable, and wherein the battery monitoring unit estimates the battery voltage course locally by sensing the battery voltage, $V_{bat}$, via the battery voltage sensor at least three times positioned at such a great mutual distance that the changes in battery voltage are significant with respect to the uncertainty in the measurement of the voltages.

17. A radio telephone having a voltage supply in the form of a battery and comprising a battery monitoring unit with an associated control device, a battery voltage sensor to sense values representing the battery voltage, and a timer enabling the control unit to register times associated with the sensed values, wherein, on the basis of the sensed values and the associated times, the control unit determines parameters for describing the battery discharge course locally for said times in response to the registered values and the associated times, and wherein the battery discharge course is assumed to follow the expression:

$$V_{bat} = \Phi - \xi \alpha^t,$$

where $\Phi$, $\xi$ and $\alpha$ are parameters which are constant at constant discharge conditions.

18. A radio telephone having a voltage supply in the form of a battery and comprising a battery monitoring unit with an associated control device, a battery voltage sensor to sense values representing the battery voltage, and a timer enabling the control unit to register times associated with the sensed values, wherein, on the basis of the sensed values and the associated times, the control unit determines parameters for describing the battery discharge course locally for said times in response to the registered values and the associated times, wherein the battery is rechargeable and permanently mounted in the telephone, and wherein the battery monitoring unit estimates the battery voltage course locally by sensing the battery voltage, $V_{bat}$, via the battery voltage sensor at times positioned at such a great mutual distance that the charges in battery voltage are significant with respect to the uncertainty in the measurement of the voltages.

19. A radio telephone having a battery and a battery monitoring unit to estimate a battery voltage course by sensing the battery voltage, $V_{bat}$, via battery voltage sensor at a plurality of times, an estimating means for calculating a telephone service life measure before the battery voltage has decreased to a predetermined level, said estimating means updating the measure of the remaining service life if the battery voltage sensor registers a change in the voltage course, as well as a display means for displaying the remaining service life, wherein the monitoring unit assumes that the battery voltage decreases as a power function with time t from an initial value.

20. A radio telephone according to claim 19, wherein the display means is a display for displaying a digital value of the remaining service life.

21. A radio telephone according to claim 20, wherein the display displays the remaining service life in the form of a minute number for the telephone standby time.

22. A radio telephone according to claim 19, wherein the estimating means employs a predetermined correction factor when updating the measure of the remaining service life.

* * * * *